US012548741B2

(12) United States Patent
Min et al.

(10) Patent No.: US 12,548,741 B2
(45) Date of Patent: Feb. 10, 2026

(54) FOCUS RING AND PLASMA ETCHING DEVICE INCLUDING SAME

(71) Applicant: Solmics Co., Ltd., Pyeongtaek-si (KR)

(72) Inventors: Kyungyeol Min, Seoul (KR); Yongsoo Choi, Seoul (KR); SungSic Hwang, Seoul (KR); Kyungin Kim, Seoul (KR); Jungkun Kang, Seoul (KR); Su Man Chae, Seoul (KR)

(73) Assignee: Solmics Co., Ltd., Pyeongtaek-si (KR)

( * ) Notice: Subject to any disclaimer, the term of this patent is extended or adjusted under 35 U.S.C. 154(b) by 413 days.

(21) Appl. No.: 18/349,557

(22) Filed: Jul. 10, 2023

(65) Prior Publication Data

US 2024/0030007 A1 Jan. 25, 2024

(30) Foreign Application Priority Data

Jul. 21, 2022 (KR) ........................ 10-2022-0090392

(51) Int. Cl.
*H01J 37/32* (2006.01)

(52) U.S. Cl.
CPC .. *H01J 37/32642* (2013.01); *H01J 37/32715* (2013.01)

(58) Field of Classification Search
CPC ...................... H01J 37/32642; H01J 37/32715
See application file for complete search history.

(56) References Cited

U.S. PATENT DOCUMENTS

| | | | |
|---|---|---|---|
| 2004/0083976 A1 | 5/2004 | Meyyappan | |
| 2010/0012274 A1 | 1/2010 | Miyagawa et al. | |
| 2010/0310785 A1 | 12/2010 | Sasakawa et al. | |
| 2011/0000883 A1 | 1/2011 | Endoh et al. | |
| 2016/0351378 A1* | 12/2016 | Kishi | H01L 21/68735 |
| 2017/0278681 A1 | 9/2017 | Qi et al. | |
| 2018/0182635 A1 | 6/2018 | Tsukahara et al. | |
| 2020/0161100 A1 | 5/2020 | Chen et al. | |
| 2021/0082671 A1 | 3/2021 | Ikegami | |
| 2021/0391151 A1 | 12/2021 | Ikegami | |

FOREIGN PATENT DOCUMENTS

| | | | |
|---|---|---|---|
| CN | 106206235 | A | 12/2016 |
| JP | 2016-184610 | A | 10/2016 |
| JP | 2016-225588 | A | 12/2016 |
| JP | 2018-107433 | A | 7/2018 |
| JP | 2020-205382 | A | 12/2020 |
| JP | 2021-44413 | A | 3/2021 |
| JP | 2021-197548 | A | 12/2021 |
| KR | 10-1999-0075169 | A | 10/1999 |
| KR | 10-2002-0034442 | A | 5/2002 |
| KR | 10-2002-0041340 | A | 6/2002 |
| KR | 30-0309529-0001 | B | 10/2002 |

(Continued)

*Primary Examiner* — Benjamin Kendall
(74) *Attorney, Agent, or Firm* — NSIP Law

(57) ABSTRACT

A focus ring for mounting an etching target in a plasma etching device, includes a seating portion, including a seating surface configured to accommodate the etching target; and a main body, formed on an outer circumference of the seating portion, comprising a groove portion having a groove disposed in an upper surface of the main body. A height of an upper surface of the groove portion is lower than a maximum height of the upper surface of the main body.

15 Claims, 3 Drawing Sheets

(56) References Cited

FOREIGN PATENT DOCUMENTS

| | | | |
|---|---|---|---|
| KR | 30-0309531-0001 | B | 10/2002 |
| KR | 30-0335377 | B | 10/2003 |
| KR | 30-0335381 | B | 10/2003 |
| KR | 10-2005-0028629 | A | 3/2005 |
| KR | 30-0411787 | B | 4/2006 |
| KR | 10-2006-0127698 | A | 12/2006 |
| KR | 10-2006-0135369 | A | 12/2006 |
| KR | 10-2007-0021521 | A | 2/2007 |
| KR | 30-0492589 | B | 7/2008 |
| KR | 10-2010-0001652 | A | 1/2010 |
| KR | 10-2010-0133910 | A | 12/2010 |
| KR | 20-2011-0005665 | U | 6/2011 |
| KR | 30-0717571 | B | 11/2013 |
| KR | 10-1592124 | B1 | 2/2016 |
| KR | 10-2017-0014384 | A | 2/2017 |
| KR | 30-0958205 | B | 5/2018 |
| KR | 10-2018-0076311 | A | 7/2018 |
| KR | 10-1889726 | B1 | 8/2018 |
| KR | 10-2019-0013362 | A | 2/2019 |
| KR | 30-1012865 | B | 7/2019 |
| KR | 30-1024427 | B | 9/2019 |
| KR | 30-1026247 | B | 10/2019 |
| KR | 30-1026248 | B | 10/2019 |
| KR | 30-1031363 | B | 11/2019 |
| KR | 30-1051252 | B | 3/2020 |
| KR | 10-2020-0052973 | A | 5/2020 |
| KR | 10-2022-0087415 | A | 6/2022 |
| TW | 201515143 | A | 4/2015 |
| WO | WO 2016/136255 | A1 | 9/2016 |

* cited by examiner

FOCUS RING AND PLASMA ETCHING DEVICE INCLUDING SAME

CROSS-REFERENCE TO RELATED APPLICATION

This application claims the benefit under 35 USC § 119(a) of Korean Patent Application No. 10-2022-0090392, filed on Jul. 21, 2022, in the Korean Intellectual Property Office, the entire disclosure of which is incorporated herein by reference for all purposes.

BACKGROUND

1. Field

The following description relates to a focus ring and a plasma etching device including the same.

2. Discussion of Related Art

In order to form fine patterns of highly integrated semiconductor devices, plasma etching, which is dry etching, is mainly used on substrates. A plasma etching device includes a chamber, an electrostatic chuck disposed in the chamber, and parts such as electrodes installed above and below the electrostatic chuck to apply high-frequency power. A plasma etching process may be performed by converting a gas introduced into the chamber into plasma using high-frequency power applied between the electrodes and etching a substrate mounted on the electrostatic chuck using the plasma. Radicals or ions constituting the plasma physically and chemically react with and etch a surface of the substrate.

Since the plasma of the plasma etching device is generated by the high-frequency power applied above and below the electrostatic chuck where an etching target is placed, it is easy to control the plasma in a portion where the high-frequency power is applied, but it is relatively difficult to directly control the plasma in an outer portion of the electrostatic chuck. An amount of the plasma generated in the outer portion of the electrostatic chuck is relatively small, and thus an etch rate of an edge of the substrate may be slightly lower than that of a central region of the substrate. Therefore, it may be difficult to perform uniform etching on the entire surface of the substrate.

The foregoing background art is technical information that the inventors possess for derivation of an embodiment or that they acquired during the derivation process, and thus the technical information cannot necessarily be referred to as the known art disclosed to the general public prior to filing of the present disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a focus ring for mounting an etching target in a plasma etching device, includes a seating portion, including a seating surface configured to accommodate the etching target; and a main body, formed on an outer circumference of the seating portion, comprising a groove portion having a groove disposed in an upper surface of the main body. A height of an upper surface of the groove portion is lower than a maximum height of the upper surface of the main body, a ratio Vg/Vf of a volume Vg of the groove to a sum Vf of the volume Vg of the groove and a volume of the focus ring ranges from 0.1 to 0.5, and the volume Vg is: $Vg=(Hb-Hg)\times Wavg\times Lsum$, where Hb denotes a maximum height of the upper surface of the main body, Hg denotes an average height of the upper surface of the groove portion, Wavg denotes an average width of the groove portion viewed in a radial direction of the focus ring, and Lsum denotes the sum of lengths of the groove portion based on a circumferential direction of the focus ring.

The main body may include a connector disposed on the outer circumference of the seating portion, the groove portion disposed on an outer circumference of the connector, and an edge portion disposed on an outer circumference of the groove portion.

A ratio of a width Ws of the connector to a width Wg of the groove portion, Ws/Wg, may range from 0.04 to 0.2.

In the radial direction of the focus ring, a maximum width of the groove portion may range from 15 mm to 25 mm.

An average thickness of the focus ring may be 3.2 mm or less.

A ratio of an average thickness Tg of the groove portion to an average thickness Tb of the main body, Tg/Tb, excluding the groove portion, may range from 0.16 to 0.72.

The average thickness of the groove portion may range from 0.5 mm to 2.3 mm.

The average thickness of the main body, excluding the groove portion, may range from 2.2 mm to 3.2 mm.

An average thickness of the seating portion may range from 1 mm to 2 mm.

A width of the seating portion may range from 2 mm to 8 mm based on the radial direction of the focus ring.

An upper surface roughness Ra of the main body may range from 0.05 μm to 0.5 μm.

An average thickness of the main body, excluding the groove portion, may range from 2.2 mm to 3.2 mm.

A bottom surface of the edge portion may include a lower groove portion, and a minimum width from a bottom surface of the groove portion to the lower groove portion may range from about 0.5 mm to 5 mm based on the radial direction of the focus ring.

An incline step difference of a bottom surface of the focus ring between an innermost circumference and an outermost circumference of the bottom surface may range from 0.1 μm to 12 μm.

A plasma etching device may include the focus ring described herein, a chamber, and an electrostatic chuck and an upper electrostatic chuck disposed inside the chamber. The focus ring may surround an outer circumference of an etching target mounted on the upper electrostatic chuck. The electrostatic chuck may be disposed below the focus ring, and an electrode of the electrostatic chuck may be disposed in a region below the focus ring.

Other features and aspects will be apparent from the following detailed description, the drawings, and the claims.

Figure 1:
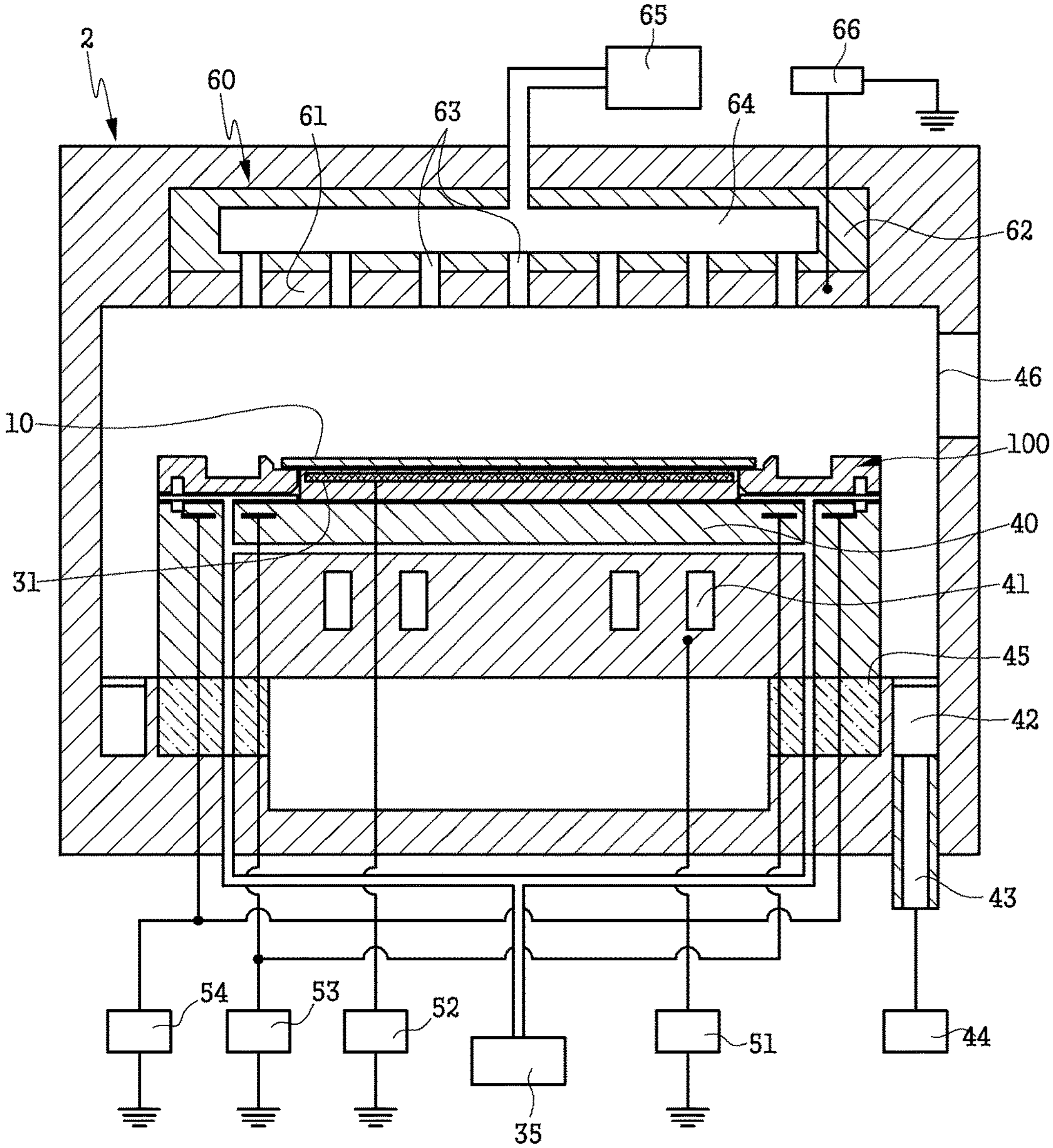
FIG. 1 is a schematic diagram illustrating an example of a plasma etching device according to one or more embodiments.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

In the present specification, the meaning of B being positioned on A means that B is positioned directly on A or B is positioned on A with another layer interposed therebetween, and it is not interpreted as being limited to B being positioned in contact with a surface of A.

Throughout the present specification, the term "a combination thereof" included in an expression of a Markush form means a mixture or combination of one or more selected from the group consisting of components described in the expression of the Markush form and means including one or more selected from the group consisting of the above components.

In order to improve etch uniformity with respect to the substrate, a focus ring is provided on an outer circumference of an etching target mounted on the electrostatic chuck to surround the etching target. When the plasma etching process is performed in the etching device, the focus ring draws the plasma toward a surface of the etching target, thereby improving process efficiency.

In order to improve the process efficiency of the etching target through the focus ring, various shape changes, such as providing an inclination may be used but shaking of the focus ring during the etching process may be mitigated to more stably fix the focus ring and achieve uniform etching of the etching target.

The present disclosure is directed to providing a focus ring which is more stably fixed to parts of a plasma etching device and performs uniform etching on an etching target.

The present disclosure is also directed to providing a focus ring which provides good electrostatic attraction with an electrostatic chuck of the plasma etching device.

FIG. 1 illustrates a schematic form of the plasma etching device according to one or more embodiments.

Figure 2:
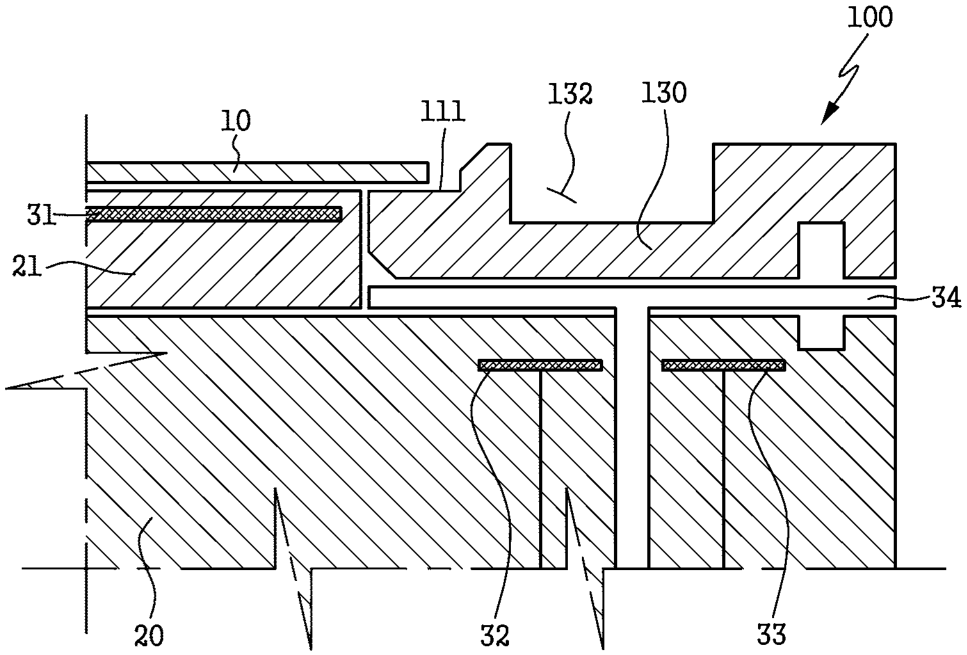
FIG. 2 is a schematic diagram illustrating an example of a focus ring applied to the plasma etching device according to one or more embodiments.
Figure 3:
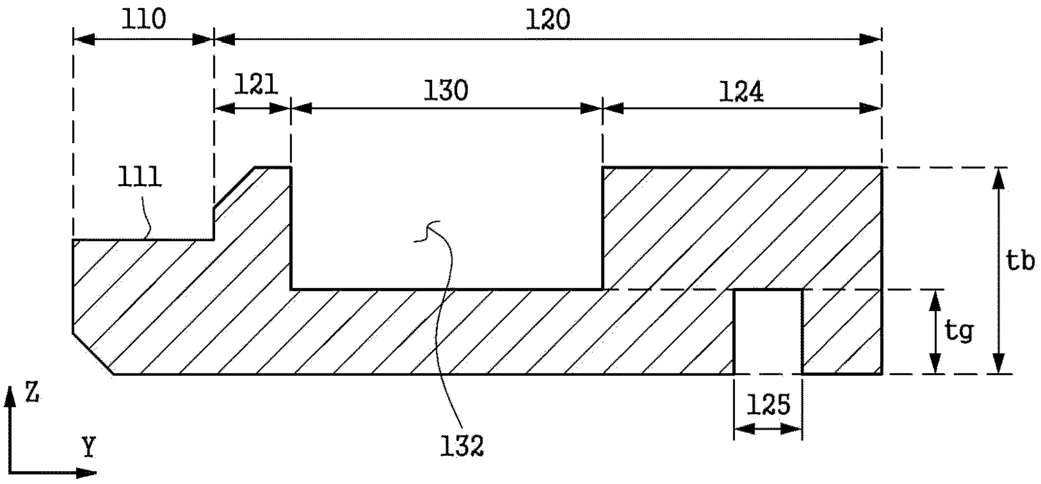
FIG. 3 is a front view illustrating a partial portion of a right side of the focus ring according to one or more embodiments from a frontal point of view.
Figure 4:
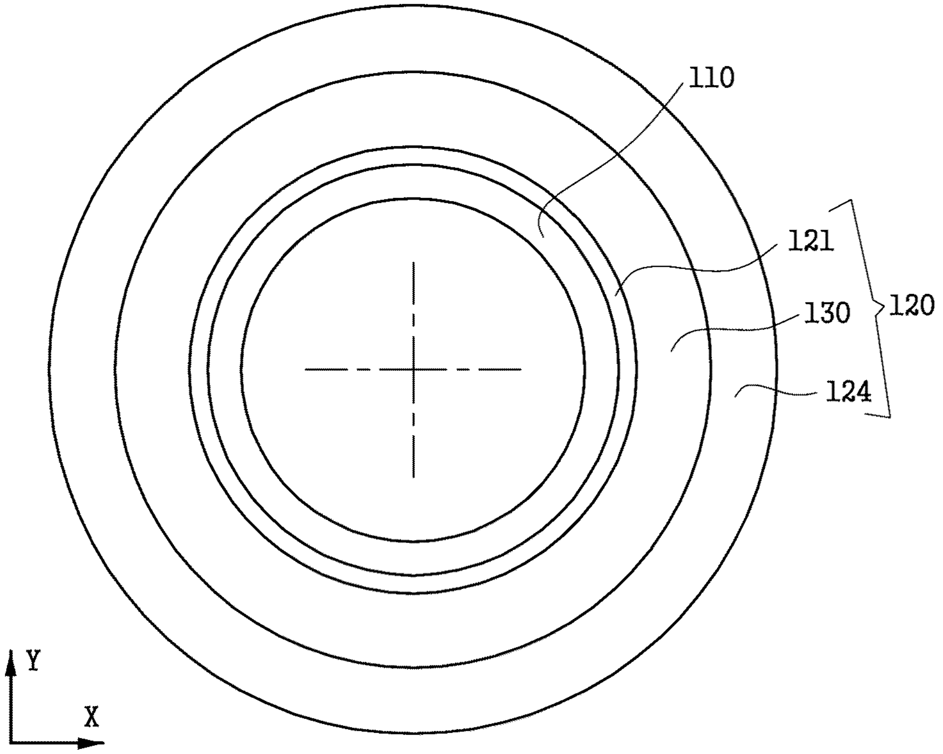
FIG. 4 is a plan view illustrating the focus ring according to one or more embodiments from a top point of view.

FIGS. 2 to 4 are diagrams illustrating a schematic form of the focus ring 100 according to one or more embodiments.

The focus ring 100, according to one or more embodiments, is a focus ring disposed in a plasma etching device to allow an etching target 10 to be mounted and may include a seating portion 110, including a seating surface 111 on which the etching target is mounted, and a main body 120 formed on an outer circumference of the seating portion.

The main body 120 includes a groove portion 130 disposed in at least a portion of the main body. The groove portion 130 is a portion of an upper surface of the main body 120 in which a groove is formed, and an upper surface of the groove portion may have a height that is lower than a maximum height of the upper surface of the main body.

A ratio Vg/Vf of a volume Vg of the groove 132 of the groove portion 130 to the sum Vf of the volume of the groove and a volume of the focus ring 100 may range from about 0.1 to 0.5, from about 0.19 to 0.36, or from about 0.24 to 0.34.

In this case, the volume Vg of the groove may be calculated by the following Equation 1.

$$Vg=(Hb-Hg)\times W\text{avg}\times L\text{sum} \quad \text{Equation 1}$$

In Equation 1, Hb denotes the maximum height of the upper surface of the main body 120, Hg denotes an average height of the upper surface of the groove portion, Wavg denotes an average width of the groove portion viewed in a radial direction of the focus ring 100 (a y-axis direction of FIG. 3), and Lsum denotes the sum of lengths of the groove portion based on a circumferential direction of the focus ring.

The average width Wavg of the groove portion 130 may be calculated by dividing the groove into n portions at regular intervals in the circumferential direction of the focus ring 100 and calculating an average of lengths of the n portions within the groove. n may be an integer ranging from 3 to 10.

The sum Lsum of the lengths of the groove portion 130 may be the sum of the maximum lengths of the divided grooves measured in the circumferential direction of the focus ring 100.

The average width Wavg and the sum Lsum of the lengths of the groove portion 130 may be calculated through a separate modeling program (CATIA, SolidWorks, or AutoCAD).

The groove 132 may be a space from the upper surface of the main body, which has a height that is lower than the maximum height of the main body 120, to the maximum height of the main body. The upper surface of the groove portion 130 has a height that is lower than a maximum height of the upper surface of the main body 120.

The sum Vf of the volume of the groove and the volume of the focus ring 100 may be calculated by adding the volume of the focus ring to the volume Vg of the groove.

Any modeling program (CATIA, SolidWorks, or AutoCAD) may be used without limitation as long as it can calculate the volume of the groove through modeling in the calculation of the volume Vg of the groove and the sum Vf of the volume of the groove and the volume of the focus ring 100, which are defined in embodiments.

The heights of the main body 120 and the groove portion 130 may be measured based on a direction perpendicular to the radial direction of the focus ring 100.

The focus ring 100 having the volume ratio of the groove portion 130 to the groove 132 may induce electrostatic adsorption to be formed more stably with the electrostatic chuck, which is an insulating component of the plasma etching device positioned below the focus ring, and an improvement in a chucking force between the electrostatic chuck and the focus ring may be expected. When the volume ratio of the focus ring 100 is less than or exceeds the volume ratio of the groove portion, stable fixation may not be achieved, or abrasion resistance may be degraded and cracks can easily occur.

The volume of the groove 132 of the groove portion 130 may range, for example, from about 8,268 $mm^3$ to 41,342 $mm^3$, or from about 15,720 $mm^3$ to 29,501 $mm^3$, but the volume may be varied according to a size of the ring, which is varied according to a diameter and a size of the etching target 10.

A chucking force Fc between the electrostatic chuck 20 and the focus ring 100 may be approximately calculated using Equation 2.

$$Fc=(\varepsilon_0\times\varepsilon_r\times A\times V)/(2\times D^2) \quad \text{Equation 2}$$

In Equation 2, $\varepsilon_0$ denotes the permittivity of a vacuum, $\varepsilon_r$ denotes the permittivity of the focus ring, A denotes a cross-sectional area in which the focus ring is in contact with the electrostatic chuck, V denotes a voltage applied to an electrode positioned below the electrostatic chuck in contact with the focus ring, and D denotes an average thickness of the focus ring.

The chucking force Fc should be understood as a relative value, not an absolute value, and it can be seen that, when other conditions are constant, the chucking force Fc is inversely proportional to the square of the average thickness of the focus ring.

An increased rate of the chucking force of the focus ring 100 may range from 152% to 500% compared to a focus ring without the groove portion 130 (not grooved). Since the focus ring 100 has an increased rate of the chucking force, the focus ring 100 may be stably fixed to the electrostatic chuck of the plasma etching device.

The average thickness of the focus ring 100 may be about 3.2 mm or less, about 3.0 mm or less, or about 2.7 mm or less. The average thickness of the focus ring may be about 1.7 mm or more, or about 2 mm or more. The focus ring satisfying the above thickness ranges may be stably fixed to the electrostatic chuck of the plasma etching device by having the above-described appropriate groove portion and may exhibit good durability.

The average height of the focus ring 100 may be about 3.2 mm or less, about 3.0 mm or less, or about 2.7 mm or less based on the direction perpendicular to the radial direction of the focus ring (the z-axis direction). The average height of the focus ring may be about 1.7 mm or more, or about 2 mm or more.

The groove portion 130 may represent a region that is lower than the maximum height of the focus ring 100 positioned on the outer circumference of the seating portion 110.

The groove portion 130 includes the groove 132 formed in the main body 120.

The groove 132 may be formed in a loop (ring) shape on the upper surface of the main body in a circumferential direction of the main body.

The groove 132 may be formed only in a portion of the upper surface of the main body.

The groove portion 130 may have the groove 132, which has an upper surface of the groove portion substantially parallel to the seating surface 111 of the seating portion and has a cross section of a substantially quadrangular shape in which a sidewall of the groove is orthogonal to the upper surface of the groove portion.

The groove portion 130 may have the groove 132 with a cross section of a substantially quadrant or triangular shape, which has one side surface to which an imaginary line substantially parallel to the seating surface 111 of the seating portion is orthogonal and a sidewall of the groove portion and the other side surface connected to the one side surface and inclined.

The groove portion 130 may have the groove 132 carved in a concave shape, a convex shape, or a combination thereof, in a form in which the upper surface of the groove portion is curved.

The upper surface of the groove portion may be formed to have a partially curved surface and a partially angular shape.

An average thickness of the groove portion 130 may range from about 0.5 mm to 2.3 mm or from about 1 mm to 2 mm.

When viewed in the direction perpendicular to the radial direction of the focus ring 100, an average height of the groove portion 130 may range from about 0.5 mm to 2.3 mm, or from about 1 mm to 2 mm.

When viewed in the radial direction of the focus ring 100, a maximum width of the groove portion 130 may range from about 15 mm to 25 mm, or from about 17 mm to 22 mm.

A ratio Tg/Tb of the average thickness Tg of the groove portion 130 to an average thickness Tb of the main body 120, excluding the groove portion, may range from about 0.16 to 0.72, or from about 0.19 to 0.58.

The average thickness Tg of the groove portion 130 and the average thickness Tb of the main body 120, excluding the groove portion, may each be calculated by dividing the main body 120 into n portions at regular intervals in the radial direction of the focus ring 100 and averaging thicknesses of the divided n portions. n may be an integer ranging from 3 to 10. In addition, modeling programs (CATIA, SolidWorks, or AutoCAD) capable of calculating an average thickness through modeling may be utilized.

Since the groove portion 130 has the above thickness, height, width, and Tg/Tb, damage or cracks can be prevented, and the focus ring 100 can stably induce adsorbability with the electrostatic chuck of the plasma etching device.

The seating portion 110 may include the seating surface 111 on which the etching target 10 may be mounted. The seating surface may be formed to have a predetermined width in the radial direction of the focus ring 100 and may have a flat surface on which the etching target may be mounted.

An average thickness of the seating portion 110 may range from about 1 mm to 2 mm, or from about 1.2 mm to 1.8 mm.

When viewed in the direction perpendicular to the radial direction of the focus ring 100, an average height of the seating portion 110 may range from about 1 mm to 2 mm, or from about 1.2 mm to 1.8 mm.

A width of the seating portion 110 may range from about 2 mm to 8 mm, or from about 3 mm to 7 mm based on the radial direction of the focus ring 100.

Since the seating portion 110 has the above thickness, height, and width, the etching target 10 can be comfortably mounted, and stability can be secured.

The main body 120 may have a thickness different from that of the seating surface 111 of the seating portion 110 to extend to the outer circumference or may have a larger thickness to extend to the outer circumference.

The seating portion 110 and the main body 120 may each have a loop (ring) shape but may be changed according to the shape of the etching target.

The main body 120 may include a connector 121 positioned on the outer circumference of the seating portion 110. An upper surface of the connector may be parallel to the seating surface 111, the entire upper surface of the connector may be inclined, or a portion of the upper surface of the connector may be inclined and the remaining portion thereof may be parallel to the seating surface. In the inclined region of the connector, an inclination angle may be greater than 0° and less than 70° based on the seating surface. When the connector 121 has the above inclination angle, a flow of plasma ions in the plasma etching device can be more stably controlled.

A width of the connector 121 may range from about 1 mm to 3 mm, or from about 1.5 mm to 2.5 mm based on the radial direction of the focus ring 100.

A width ratio Ws/Wg of the width Ws of the connector 121 to the width Wg of the groove portion 130 viewed in the radial direction of the focus ring 100 may range from about 0.04 to 0.2, or from about 0.05 to 0.16. The focus ring 100 with the above width ratio Ws/Wg may prevent etching uniformity from degrading due to a groove shape during plasma etching.

An upper surface roughness Ra of the main body 120 may range from about 0.05 μm to 0.5 μm, or from about 0.08 μm to 0.3 μm. Since the main body 120 has the upper surface roughness Ra, a good etching rate of the etching target can be exhibited during the etching process in the plasma etching device.

An average thickness of the main body 120, excluding the groove portion 130, may range from about 2.2 mm to 3.2 mm, or about 2.5 mm to 3 mm. Since the above-average thickness is satisfied and the focus ring 100 may be stably fixed to the electrostatic chuck of the plasma etching device, durability can be increased, and easy damage can be prevented.

An edge portion 124 of the focus ring 100 is positioned on the outer circumference of the groove portion 130 to be stably fixed to the electrostatic chuck of the plasma etching device. An average thickness of the edge portion may be greater than the average thickness of the groove portion.

The average thickness of the edge portion 124 may range from about 1.7 mm to 3.7 mm, or from about 1.9 mm to 3.5 mm. The edge portion having the average thickness may maintain an overall balance when the focus ring 100 is placed on the electrostatic chuck of the plasma etching device.

The edge portion 124 may include a lower groove portion 125, a portion of a bottom surface in which a groove is formed.

A minimum width from a bottom surface of the groove portion to the lower groove portion 125 based on the radial direction of the focus ring 100 may range from about 0.5 mm to 5 mm, or from about 1 mm to 3 mm. Since the minimum width is satisfied, appropriate cooling efficiency can be exhibited during the plasma etching.

An inner diameter of the focus ring may be varied according to the length or diameter of the etching target 10 based on an inner circumference of the focus ring 100 and may range, for example, from about 100 mm to 400 mm.

Like the inner diameter, an outer diameter of the focus ring may be varied according to the length or diameter of the etching target 10 based on an outer circumference of the focus ring 100 and may range, for example, from about 150 mm to 500 mm.

A bottom surface of the focus ring 100 may be inclined to allow a step difference between the innermost circumference and the outermost circumference to range from about 0.1 μm to 12 μm, or from about 1 μm to 7 μm. For example, based on a surface parallel to the seating surface 111 of the focus ring of FIG. 3, the bottom surface of the focus ring may be inclined at a predetermined angle to have the step difference.

In addition, an imaginary bottom surface of the inner circumference parallel to the seating surface and being in contact with a lower portion of the inner circumference of the focus ring may have the step difference with an imaginary bottom surface of the outer circumference parallel to the seating surface and being in contact with a lower portion of the outer circumference of the focus ring. Specifically, the imaginary bottom surface of the outer circumference may have a higher position than the imaginary bottom surface of the inner circumference.

The focus ring having the inclination may allow a cooling gas to circulate effectively on the bottom surface and allow the etching target to be uniformly etched during the plasma etching.

The focus ring 100 may include silicon carbide (SiC) or boron carbide ($B_4C$). Silicon carbide and boron carbide are materials with very high strength and excellent chemical and etch resistance.

In embodiments, the silicon carbide is any compound based on silicon and carbon, and the boron carbide is any compound based on boron and carbon. The silicon carbide or boron carbide may be either a single or composite phase. Here, the single phase includes both a stoichiometric phase and a non-stoichiometric phase outside of a stoichiometric composition. The silicon carbide or boron carbide of embodiments includes a case in which impurities are added to a single phase or a composite phase to form a solid solution or in which impurities are inevitably added in the manufacturing process are mixed.

A thermal conductivity value of the boron carbide applied to the focus ring 100 measured at a temperature ranging from 25° C. to 800° C. may range from about 5 W/mK to 60 W/mK. The boron carbide having the thermal conductivity may have better etch resistance.

A relative density of the boron carbide applied to the focus ring 100 may range from about 97% to about 99.999%.

Porosity of the boron carbide applied to the focus ring 100 may range from about to about 3%.

The focus ring 100, having these relative density and porosity characteristics, may have stronger etch resistance.

When the upper surface of the main body 120 of the focus ring 100 is etched for an exposure time of about 300 minutes with a plasma power of about 800 W and a chamber pressure of about 100 mTorr, an average etching rate of the upper surface may range from about 0.5% to 1.2%. When the focus ring having the etching rate is applied to the plasma etching device, the durability of the focus ring can be increased, and a frequency of replacement thereof can be reduced. The etching rate is evaluated by the average etching rate of the upper surface. The average etching rate of the upper surface is evaluated by averaging etching rates evaluated at least three points on the upper surface at a predetermined distance.

Plasma Etching Device

FIGS. 1 and 2 are diagrams illustrating a schematic form of the plasma etching device according to one or more embodiments. Hereinafter, the plasma etching device, according to one or more embodiments, will be described with reference to FIGS. 1 and 2.

The plasma etching device, according to one or more embodiments, includes a chamber 2, the electrostatic chuck 20 and the upper electrostatic chuck 21 disposed inside the chamber, and the focus ring 100, which surrounds an outer circumference of the etching target 10 mounted on the upper electrostatic chuck.

The electrostatic chuck may be disposed below the focus ring.

An electrode of the electrostatic chuck may be disposed in a region positioned below the focus ring, and the focus ring may be the above-described focus ring.

The plasma etching device, according to one or more embodiments, includes the chamber 2 made of a metal material, and a plasma etching process of the etching target may be performed inside the chamber.

The upper electrostatic chuck 21 on which a substrate such as a wafer is mounted as the etching target may be disposed inside the chamber 2.

The electrostatic chuck 20 and the upper electrostatic chuck 21 may have volume resistivity capable of exhibiting a Coulomb force and may include ceramic materials such as aluminum nitride, silicon nitride, and aluminum oxide.

A first electrode 31 configured to generate an electrostatic force to induce electrostatic adsorption when the etching target 10 is mounted on an upper surface of the upper electrostatic chuck may be disposed inside the upper electrostatic chuck 21. The first electrode may be electrically connected to a first power source 52 which is a DC power source to receive DC power and may maintain electrostatic adsorption with the electrostatic chuck and the etching target to be mounted on the electrostatic chuck.

A shower head 60 may be disposed above the upper electrostatic chuck 21 to face the electrostatic chuck.

The shower head 60 may include an upper electrode 61 and an electrode support 62 supporting the upper electrode, and a plurality of through-holes 63 may be formed in the upper electrode and the electrode support. In addition, a diffusing portion 64 communicating with the plurality of through-holes may be included inside the shower head.

The upper electrode 61 of the shower head 60 may be electrically connected to an upper power source 66, and high-frequency power may be applied to the upper electrode 61.

The diffusing portion 64 inside the shower head 60 may communicate with a processing gas supply part 65, and a processing gas of the processing gas supply part may be discharged to the outside through the diffusing portion and the through-holes 63.

Hardware 40 may be disposed below the electrostatic chuck 20, and a conductive material may be included in the hardware 40.

The hardware 40 may be electrically connected to a high-frequency power source 51 for supplying high-frequency power for plasma generation. Thus, high-frequency power may be applied to the hardware.

A hardware cooler 41 may be included inside the hardware 40, and the hardware may communicate with a cooling gas supply part 35 to allow the cooling gas to flow.

An exhaust path 42 may be formed between the sidewall of the chamber 2 and the hardware 40 or a support 45 supporting the hardware. An exhaust outlet 43 may be disposed below the exhaust path and may communicate with an exhaust device 44. The exhaust device 44 may include an exhaust part such as a vacuum pump and may depressurize a space within the chamber to a predetermined vacuum level.

An entrance 46 through which the etching target 10 may be loaded and unloaded may be included on the sidewall of the chamber 2.

The focus ring 100 may be disposed on the outer circumference of the etching target mounted on the upper electrostatic chuck 21. The focus ring may have the same configuration as described above.

A cooling portion 34 through which the cooling gas may be supplied may be disposed on the electrostatic chuck 20 in a lower region of the focus ring 100.

Since the focus ring 100 has the above-described groove portion 130 and the above-described volume ratio, stable chucking with the electrostatic chuck 20 may be achieved with the cooling portion 34 interposed therebetween during plasma etching, and overall balance can be maintained.

The cooling portion 34 may communicate with the cooling gas supply part 35 to allow the cooling gas to flow.

The cooling gas supply part 35 may supply the cooling gas to the cooling portion 34 facing the focus ring 100 and supply the cooling gas to a space between the upper electrostatic chuck 21 and the etching target 10 through a separate flow path.

For example, helium gas may be used as the cooling gas.

In the electrostatic chuck 20, a second electrode 32 and a third electrode 33 may be disposed in a region located below the focus ring 100, and the second electrode 32 and the third electrode 33 may be electrically connected to a second power source 53 and a third power source 54, respectively, which supply DC power. Thus, electrostatic adsorption may be achieved between the focus ring 100 and the electrostatic chuck 20 below the focus ring 100.

Each component of the plasma etching device may be connected to a controller.

The controller includes a central processing unit and a memory device, reads and executes programs and processing processes stored in the memory device, and controls an etching process of the plasma etching device on the etching target 10. In addition, the controller may also control a process of electrostatically adsorbing the focus ring 100 or a process of supplying the cooling gas according to the process of the etching target.

A horizontal magnetic field may be formed inside the chamber 2 in one direction through a separate magnet.

A high-frequency electric field may be formed inside the chamber 2 in one direction by high-frequency power applied between the hardware 40 and the shower head 60. Thus, magnetron discharging may proceed inside the chamber through the processing gas, high-density plasma may be generated from the processing gas on the etching target 10 mounted on the upper electrostatic chuck 21 above the hardware, and a surface of the etching target may be etched by radicals or ions in the plasma.

The etching of the plasma etching device may proceed for about 100 hours or more at a chamber pressure of about 500 mTorr or less, with the processing gas containing a fluorine-containing compound or a chlorine-containing compound, and at a power ranging from about 500 W to 15,000 W.

Manufacturing Method of Focus Ring 100

According to one or more embodiments, a manufacturing method of the focus ring 100 may include any one among sintering, chemical vapor deposition, and physical vapor deposition.

Hereinafter, a sintering process of the manufacturing method of the focus ring 100 will be described.

The sintering process of the manufacturing method of the focus ring 100 includes a preparation operation of charging a raw material into a mold, and a sintering operation of applying a predetermined temperature and a predetermined pressure to the mold and sintering the mold.

In the preparation operation, a raw material is first prepared to manufacture the focus ring 100. The raw material may be a ceramic, silicon carbide, boron carbide, or the like. The raw material may include ceramic particles and have a powder form.

The powder of the raw material may have an average particle diameter ranging from about 0.3 μm to 1.5 μm based on D50. By applying the particle diameter, a density and corrosion resistance of the sintered body can be increased, and good workability and productivity can be exhibited.

The preparation operation may include preparing a slurry by mixing the raw material with a solvent and an additive and a granulation process of drying the slurry to prepare granules.

The preparation operation may include a molding process of manufacturing a molded body by primarily molding the raw material.

The molding process may employ a method of loading the raw material into a mold and pressurizing the mold at a pressure ranging from about 100 MPa to 200 MPa.

In the sintering operation, a predetermined pressure and a predetermined temperature may be applied to the mold that has undergone the preparation operation to sinter the raw material.

As the sintering of the sintering operation, high-temperature and high-pressure sintering, spark plasma sintering, or the like may be employed.

A groove of the focus ring 100 may be formed according to a shape of the mold or may be formed through separate grinding, grooving, or polishing after the molding or sintering.

In accordance with a focus ring according to the embodiments, good durability and corrosion resistance can be exhibited along with more improved electrostatic attraction with an electrostatic chuck of a plasma etching device.

In accordance with a plasma etching device to which the focus ring, according to the embodiments, is applied, a uniform etch rate can be exhibited during plasma etching of an etching target.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A focus ring for mounting an etching target in a plasma etching device, the focus ring comprising:

a seating portion, including a seating surface configured to accommodate the etching target; and a main body, formed on an outer circumference of the seating portion, comprising a groove portion having a groove disposed in an upper surface of the main body, wherein a height of an upper surface of the groove portion is lower than a maximum height of the upper surface of the main body, a ratio Vg/Vf of a volume Vg of the groove to a sum Vf of the volume Vg of the groove and a volume of the focus ring ranges from 0.1 to 0.5, and the volume Vg is:

$$Vg=(Hb-Hg)\times W\text{avg}\times L\text{sum},$$

where Hb denotes a maximum height of the upper surface of the main body, Hg denotes an average height of the upper surface of the groove portion, Wavg denotes an average width of the groove portion viewed in a radial direction of the focus ring, and Lsum denotes the sum of lengths of the groove portion based on a circumferential direction of the focus ring.

2. The focus ring of claim 1, wherein the main body comprises a connector disposed on the outer circumference of the seating portion, the groove portion disposed on an outer circumference of the connector, and an edge portion disposed on an outer circumference of the groove portion.

3. The focus ring of claim 2, wherein a ratio of a width Ws of the connector to a width Wg of the groove portion, Ws/Wg, ranges from 0.04 to 0.2.

4. The focus ring of claim 1, wherein, in the radial direction of the focus ring, a maximum width of the groove portion ranges from 15 mm to 25 mm.

5. The focus ring of claim 1, wherein an average thickness of the focus ring is 3.2 mm or less.

6. The focus ring of claim 1, wherein a ratio of an average thickness Tg of the groove portion to an average thickness Tb of the main body, Tg/Tb, excluding the groove portion, ranges from 0.16 to 0.72.

7. The focus ring of claim 6, wherein the average thickness of the groove portion ranges from 0.5 mm to 2.3 mm.

8. The focus ring of claim 6, wherein the average thickness of the main body, excluding the groove portion, ranges from 2.2 mm to 3.2 mm.

9. The focus ring of claim 1, wherein an average thickness of the seating portion ranges from 1 mm to 2 mm.

10. The focus ring of claim 1, wherein a width of the seating portion ranges from 2 mm to 8 mm based on the radial direction of the focus ring.

11. The focus ring of claim 1, wherein an upper surface roughness Ra of the main body ranges from 0.05 μm to 0.5 μm.

12. The focus ring of claim 1, wherein an average thickness of the main body, excluding the groove portion, ranges from 2.2 mm to 3.2 mm.

13. The focus ring of claim 2, wherein:

a bottom surface of the edge portion includes a lower groove portion; and a minimum width from a bottom surface of the groove portion to the lower groove portion ranges from about 0.5 mm to 5 mm based on the radial direction of the focus ring.

14. The focus ring of claim 1, wherein an incline step difference of a bottom surface of the focus ring between an innermost circumference and an outermost circumference of the bottom surface ranges from 0.1 μm to 12 μm.

15. A plasma etching device comprising:

the focus ring of claim 1;

a chamber; and an electrostatic chuck and an upper electrostatic chuck disposed inside the chamber, wherein the focus ring surrounds an outer circumference of an etching target mounted on the upper electrostatic chuck, the electrostatic chuck is disposed below the focus ring, and an electrode of the electrostatic chuck is disposed in a region below the focus ring.

* * * * *